United States Patent [19]
Agata et al.

[11] Patent Number: 5,389,841
[45] Date of Patent: Feb. 14, 1995

[54] DIFFERENTIAL TRANSMISSION CIRCUIT

[75] Inventors: Masashi Agata; Hiroyuki Yamauchi, both of Osaka; Atsushi Fujiwara, Kyoto, all of Japan

[73] Assignee: Matsushita Electric Industrial Co., Ltd., Osaka, Japan

[21] Appl. No.: 114,142

[22] Filed: Sep. 1, 1993

[51] Int. Cl.6 .................................... H03H 17/00
[52] U.S. Cl. .................................. 327/434; 307/46; 327/65; 327/563
[58] Field of Search .......... 307/46, 291, 451, 452, 307/453, 496, 503, 521

[56] References Cited

U.S. PATENT DOCUMENTS

| | | | |
|---|---|---|---|
| 4,121,120 | 10/1978 | Wetterling | 307/291 |
| 4,697,112 | 9/1987 | Ohtani et al. | 307/496 |
| 4,733,112 | 3/1988 | Yamaguchi | 307/530 |
| 4,754,171 | 6/1988 | Dasai et al. | 307/291 |

FOREIGN PATENT DOCUMENTS

| | | |
|---|---|---|
| 56-41587 | 4/1981 | Japan . |
| 61-96587 | 5/1986 | Japan . |

OTHER PUBLICATIONS

K. Sasaki et al., "A 9-ns 1-Mbit CMOS SRAM", IEEE Journal of Solid-State Circuits, vol. 24, No. 5, pp. 1219-1225 (Oct. 1989).

*Primary Examiner*—William L. Sikes
*Assistant Examiner*—Fetsum Abraham
*Attorney, Agent, or Firm*—Willian Brinks Hofer Gilson & Lione

[57] ABSTRACT

In a MOS integrated circuit is provided a first differential amplifying circuit for receiving complementary sets of input data at the gates of its two p-channel MOS transistors and for transmitting complementary sets of internal data. There is also provided a second differential amplifying circuit for receiving the complementary sets of internal data at the gates of its two n-channel MOS transistors and for transmitting complementary sets of output data. This realizes high-speed data transmission in which data transmission speed is independent of the generation of a clock signal. By preventing the flow of current from a power supply terminal to a ground terminal, a differential transmission circuit which consumes reduced current can be obtained.

8 Claims, 15 Drawing Sheets

DIFFERENTIAL TRANSMISSION CIRCUIT

BACKGROUND OF THE INVENTION

The present invention relates to differential transmission circuits which are used in large-capacity MOS integrated circuits, such as DRAM (dynamic random-access memory) and SRAM (static random-access memory), so as to differentially transmit data.

In recent years, there has been a great demand for a differential transmission circuit which performs higher-speed data transmission in response to the increasing operating speed of a MOS integrated circuit.

FIG. 1 is a circuit diagram of a conventional differential transmission circuit, which shows a ground terminal 0, a power supply terminal 1, complementary input data lines 71 and 72, complementary internal data lines 73 and 74, complementary output data lines 75 and 76, n-channel MOS transistors (hereinafter referred to as NMOS) 77 and 78 for receiving data from the input data lines 71 and 72 at their gates, p-channel MOS transistors (hereinafter referred to as PMOS) 79 and 80 for latching data from the internal data lines 73 and 74, an NMOS 81 interposed between the sources of the NMOSs 77 and 78 and the ground terminal 0, NMOSs 82 and 83 for receiving data from the internal data lines 73 and 74 at their gates, PMOSs 84 and 85 for latching data from the output data lines 75 and 76, an NMOS 86 interposed between the sources of the NMOSs 82 and 83 and the ground terminal 0, and first, second, and third precharge circuits 87, 88, and 89 for precharging their respective data lines.

The operation of the differential transmission circuit thus constituted will be described with reference to FIGS. 2(a) to 2(e). Initially, before input data (potential difference) is applied to the input data lines 71 and 72, the data lines are precharged (equalized) by the three precharge circuits 87, 88, and 89 so that each of their voltages reaches the value which turns the NMOSs 77, 78, 82, and 83 ON. When the application of input data to the gates of the NMOSs 77 and 78 is initiated, the NMOSs 81 and 86 are switched from the OFF state to the ON state by clock signals, which activates a first differential amplifying circuit composed of four MOSs 77, 78, 79, and 80 and a second differential amplifying circuit composed of four MOSs 82, 83, 84, and 85, so that the data is transmitted from the input data lines 71 and 72 to the internal data lines 73 and 74, and then from the internal data lines 73 and 74 to the output data lines 75 and 76. In this case, since the NMOSs 77, 78, 82, and 83 are already in the ON state in initiating the transmitting operation, output data can be obtained immediately on the application of clock signals to the NMOSs 81 and 86. Moreover, the NMOSs 77 and 78 for receiving input data at their gates have great current-driving abilities. Such a differential transmission circuit is disclosed in, for example, K. Sasaki et al., "A 9-ns 1-Mbit CMOS SRAM", Journal of Silid-State Circuits, Vol. 24, No. 5, Oct. 1989, pp. 1219–1225.

With the structure mentioned above, however, timing margins should be considered in timing the application of clock signals, for malfunction such as amplifying and transmitting of wrong data may occur if the application of clock signals to the gates of the NMOSs 81 and 86 is timed earlier than the supply of input data to the gates of the NMOS 77 and 78. Consequently, the data transmission speed is determined by the timing of applying clock signals, which makes it difficult for the conventional differential transmission circuit to perform faster data transmission.

Moreover, since the voltage at each of the data lines is set to a value at which the NMOSs 77, 78, 82, and 83 are turned ON during the precharge period, current is allowed to flow from the power supply terminal 1 to the ground terminal 0, which undesirably increases consumed current of the circuit. Furthermore, the current is also allowed to flow from the power supply terminal 1 to the ground terminal 0 unless a controlling peration is performed as follows. That is, precharging is initiated after clock signals are switched OFF and, after precharging is completed, clock signals are inputted to turn the NMOSs 81 and 86 ON. Such a controlling operation inevitably delays the timing of turning NMOSs 81 and 86 ON with clock signals, which prevents higher-speed data transmission.

SUMMARY OF THE INVENTION

An object of the present invention is to provide a differential transmission circuit which realizes high-speed data transmission and reduction in consumed current.

In order to attain the object, the present invention adopts the structure comprising a first differential amplifying circuit for receiving data from complementary input data lines at the gates of its PMOSs and for transmitting data to complementary internal data lines and a second differential amplifying circuit for receiving data from the complementary internal data lines at the gates of its NMOSs and for transmitting data to complementary output data lines.

Prior to the application of input data, the input data lines and output data lines are precharged so that each of their voltages reaches the power supply voltage, while the internal data lines are precharged so that each of their voltages reaches the ground voltage. In this case, since the PMOSs in the first differential amplifying circuit and the NMOSs in the second differential amplifying circuit are in the OFF state, current is not generated even if clock signals are not supplied, which is different from the prior art. When data is inputted and the voltage variation at the data line exceeds the threshold voltage for the MOS transistors, the MOS transistors (PMOS and NMOS), which receive the data at their gates, are immediately turned on, so that output data is obtained. Consequently, the operating speed of the circuit is not determined by the timing of generating the clock signal, which enables data transmission at high speed. In addition, consumed current can also be reduced by preventing the current from flowing.

DETAILED DESCRIPTION OF THE PREFERRED EMBODIMENTS

Figure 1:
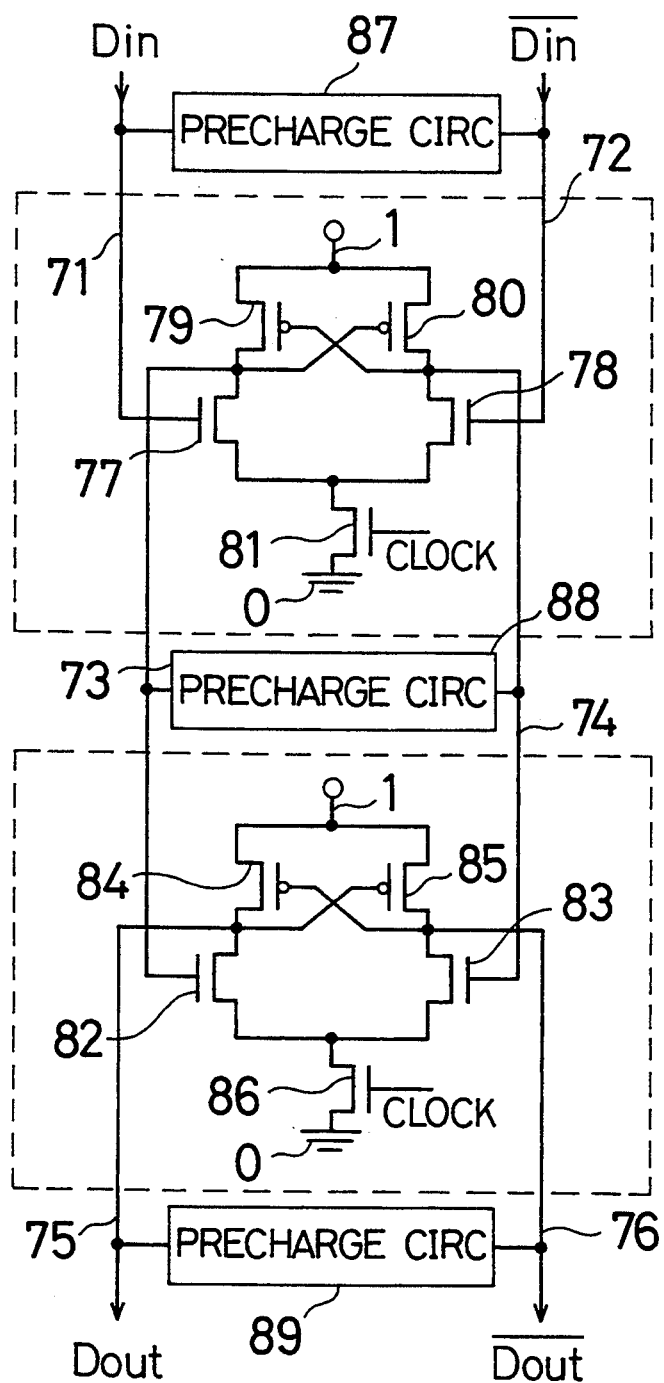
FIG. 1 is a circuit diagram of a conventional differential transmission circuit.
Figure 2:
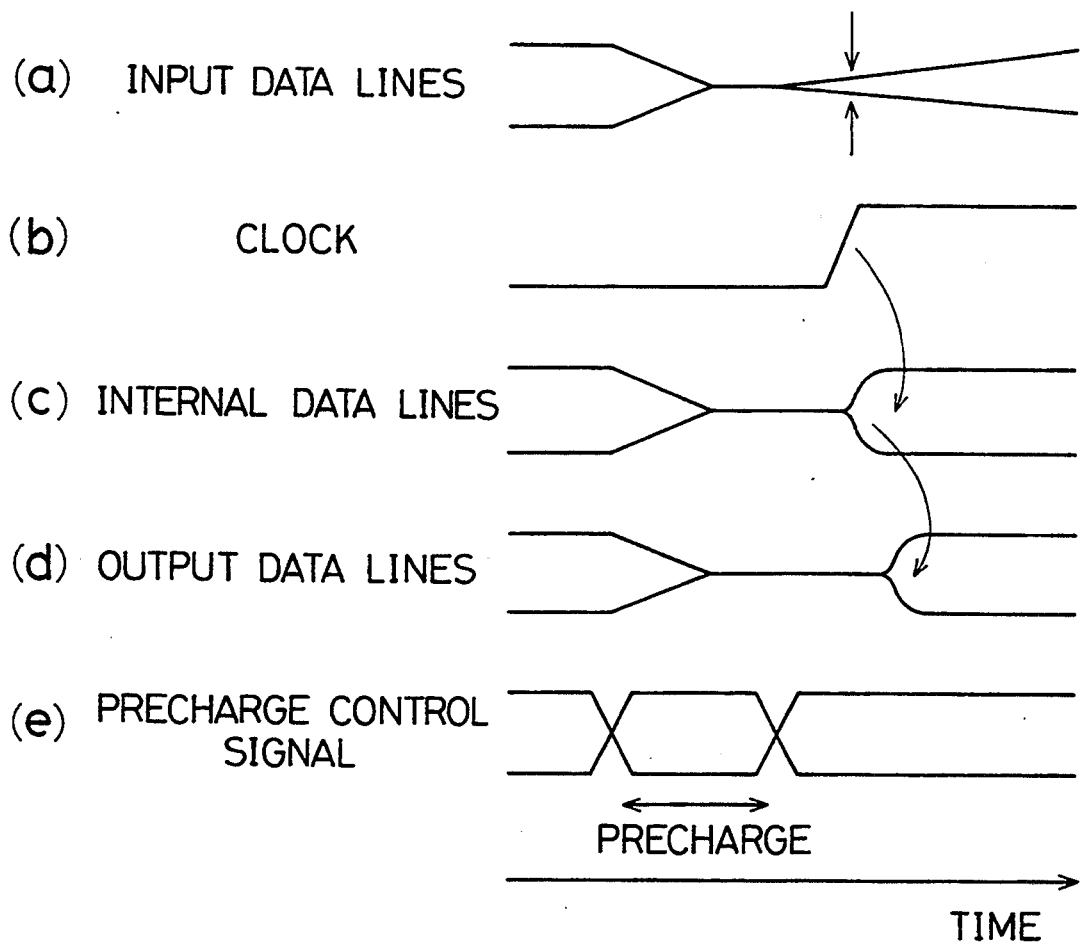
FIGS. 2(a) to 2(e) are wave form charts illustrating the operation of the differential transmission circuit of FIG. 1.

Referring now to the drawings, embodiments of the present invention will be described below.

EXAMPLE 1

Figure 3:
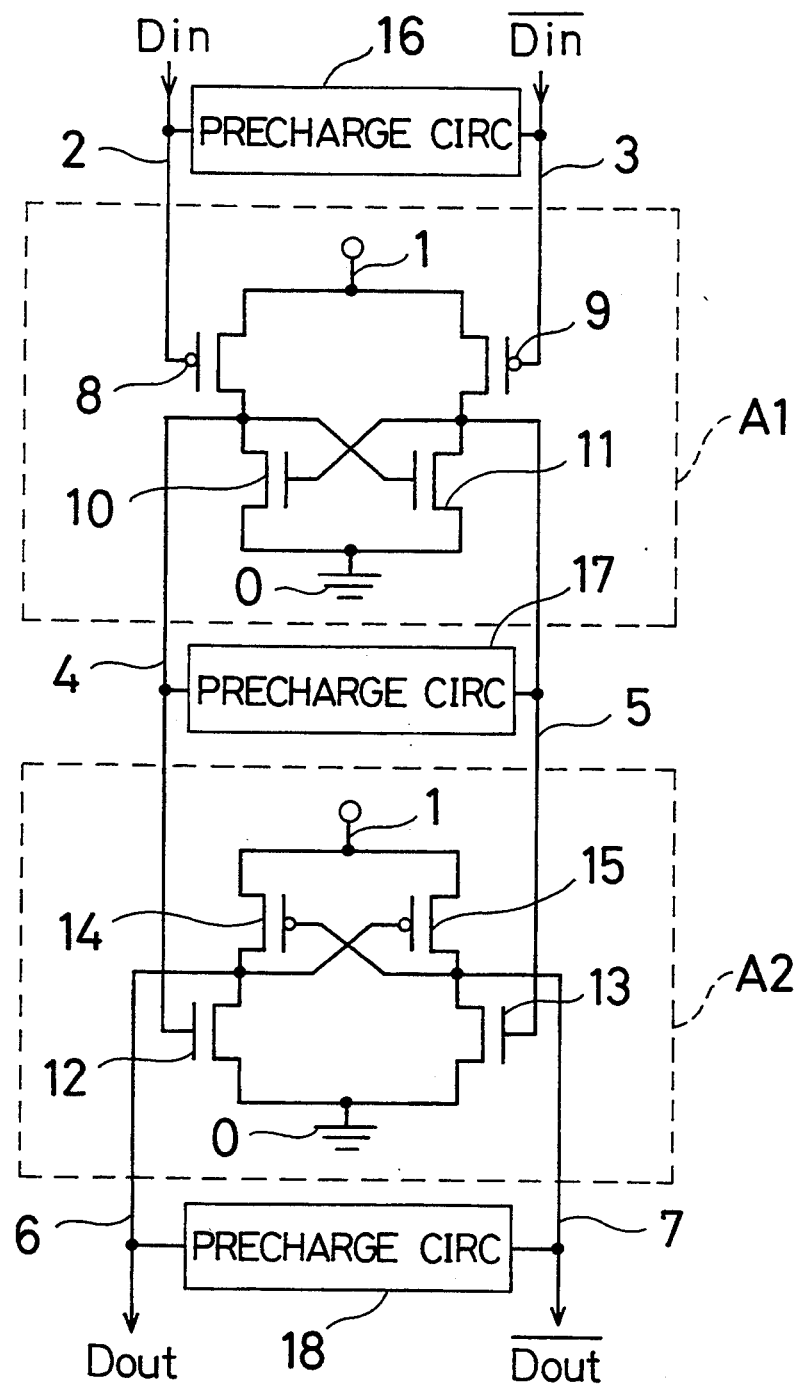
FIG. 3 is a circuit diagram of a differential transmission circuit according to a first embodiment of the present invention.
Figure 4:
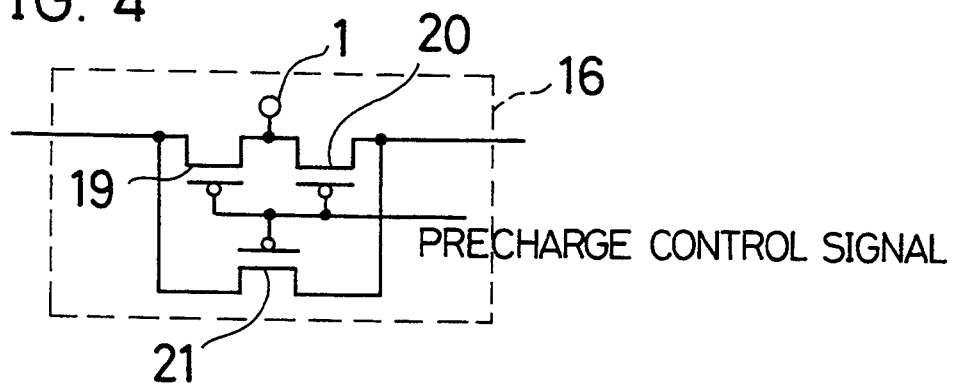
FIGS. 4 to 6 are the respective circuit diagrams of three precharge circuits shown in FIG. 3.
Figure 5:
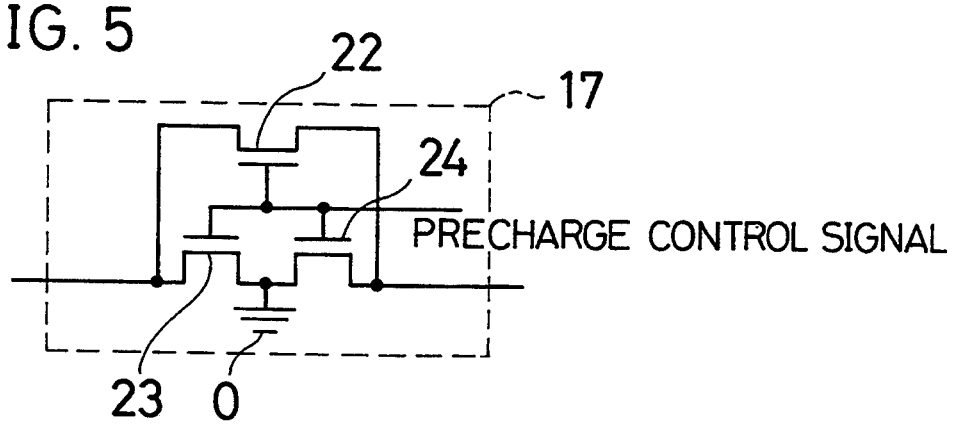
Figure 6:
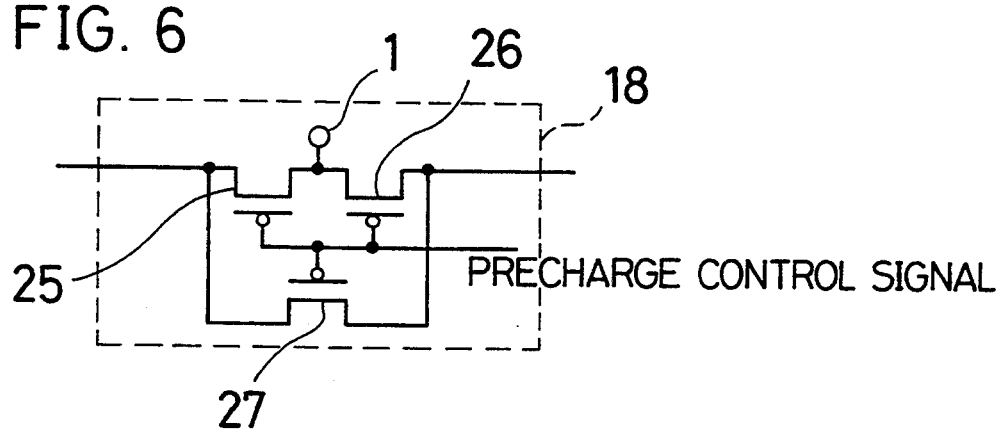
Figure 7:
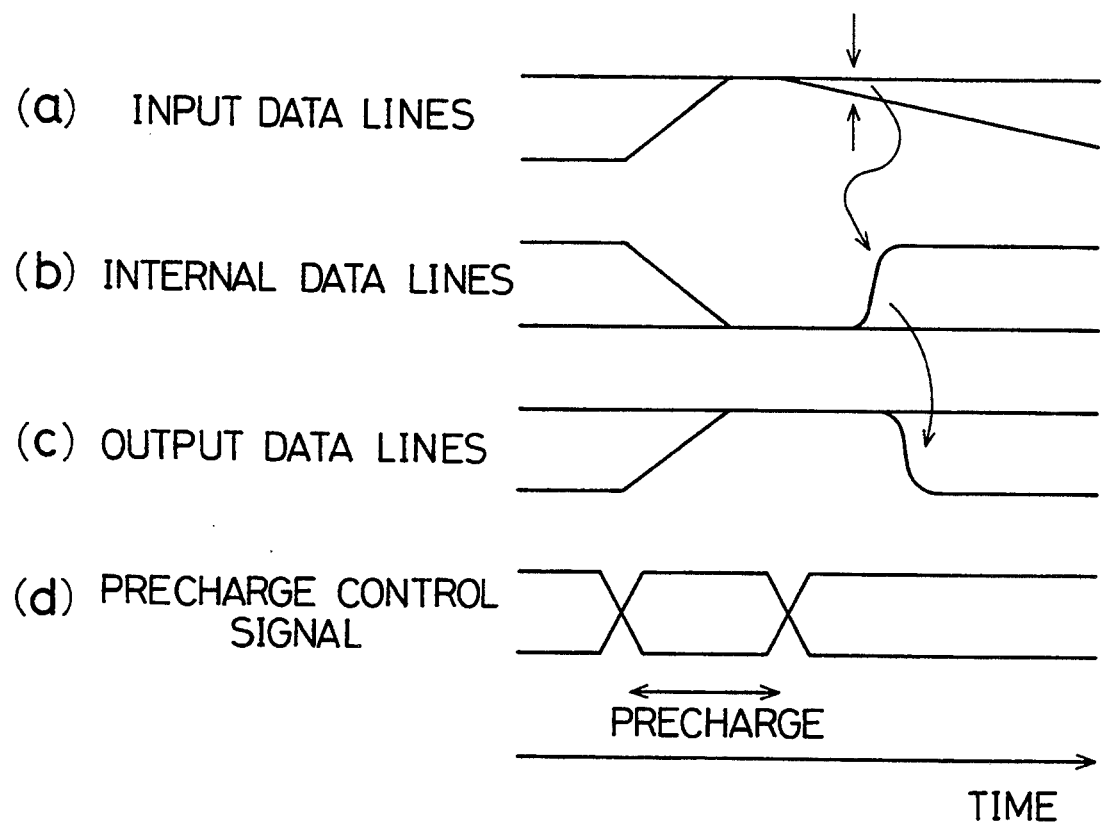
FIGS. 7(a) to (d) are wave form charts illustrating the operation of the differential transmission circuit of FIG. 3.

In FIG. 3, there are shown a ground terminal 0, a power supply terminal 1, complementary input data lines 2 and 3, complementary internal data lines 4 and 5, and complementary output data lines 6 and 7. A first differential amplifying circuit A1 is composed of a pair of PMOSs 8 and 9 and a pair of NMOSs 10 and 11. The PMOSs 8 and 9 have their gates connected to the input data lines 2 and 3, respectively, their sources connected in common to the power supply terminal 1, and their drains connected to the internal data lines 4 and 5, respectively. The NMOSs 10 and 11 have their gates connected to the internal data lines 4 and 5, respectively, their sources connected in common to the ground terminal 0, and their drains connected to the internal data lines 4 and 5, respectively, so that the gate and drain of each of the NMOSs 10 and 11 are connected to the different internal data lines, respectively, thus constituting latch circuits for the internal data lines 4 and 5. A second differential amplifying circuit A2 is composed of a pair of NMOSs 12 and 13 and a pair of PMOSs 14 and 15. The NMOSs 12 and 13 have their gates connected to the internal data lines 4 and 5, respectively, their sources connected in common to the ground terminal 0, and their drains connected to the output data lines 4 and 5, respectively. The PMOSs 14 and 15 have their gates connected to the output data lines 6 and 7, respectively, their sources connected in common to the power supply terminal 1, and their drains connected to the output data lines 6 and 7, respectively, so that the gate and drain of each of the PMOSs 14 and 15 are connected to the different output data lines, respectively, thus constituting latch circuits for the output data lines 6 and 7. A first precharge circuit 16 is composed of three PMOSs 19, 20, and 21 (FIG. 4) for precharging the input data lines 2 and 3 so that each of their voltages reaches the power supply voltage. A second precharge circuit 17 is composed of three NMOSs 22, 23, and 24 (FIG. 5) for precharging the internal data lines 4 and 5 so that each of their voltages reaches the ground voltage. A third precharge circuit 18 is composed of three PMOSs 25, 26, and 27 (FIG. 6) for precharging the output data lines 6 and 7 so that each of their voltages reaches the power supply voltage.

The operation of the differential transmission circuit thus constituted will be described with reference to FIGS. 7(a) to 7(d). Initially, before input data (potential difference) is applied to the input data lines 2 and 3, the input data lines 2 and 3, the output data lines 6 and 7, and the internal data lines 4 and 5 are precharged (equalized) so that the voltage at each of the input data lines 2 and 3 and of the output data lines 6 and 7 reaches the power supply voltage and that the voltage at each of the internal data lines 4 and 5 reaches the ground voltage. The PMOSs 8 and 9 and NMOSs 12 and 13 for receiving data at their gates are turned OFF when the transmission of precharge control signals to the precharge circuits 16 to 18 is stopped, so that the differential transmission circuit does not operate and in the state of waiting for the application of input data. When input data is applied and the voltage variation at one of the input data lines 2 and 3 exceeds the threshold voltage for the corresponding PMOS 8 or 9, the PMOS 8 or 9 is immediately turned ON so as to start charging the internal data line 4 or 5 to which its drain is connected. When the voltage variation at the corresponding internal data line 4 or 5 exceeds the threshold voltage for the corresponding NMOS 12 or 13, the NMOS 12 or 13 is immediately turned ON so as to start discharging the charge of the output data line 6 or 7. Thus, data is transmitted at high speed from the input data lines 2 and 3 to the internal data lines 4 and 5, and then from the internal data lines 4 and 5 to the output data lines 6 and 7.

As described above, unlike the prior art, data transmission speed is not determined by the timing of generating clock signals according to the present invention, so that high-speed data transmission can be realized. Moreover, since at least one of the MOS transistors in the path from the power supply terminal 1 to the ground terminal 0 is in the OFF state in operation, the current is not allowed to flow, which reduces consumed current. In the case where the present invention is applied to a read data amp. used in a 64-Mb DRAM, its data transmission speed is increased by 20 to 30% and its power consumption is decreased by 30 to 50% compared with that of the conventional differential transmission circuit using clock signals.

If MOS transistor switches are interposed between the sources of the PMOSs 8 and 9 and the power supply terminal 1 so as to disconnect them and between the sources of the PMOSs 12 and 13 and the ground terminal 0, respectively, so as to disconnect them, even when an intermediate voltage is applied to the gates of the MOS transistors through equalization of the data lines during precharging, current is prevented from flowing from the power supply terminal 1 to the ground terminal 0.

EXAMPLE 2

Figure 8:
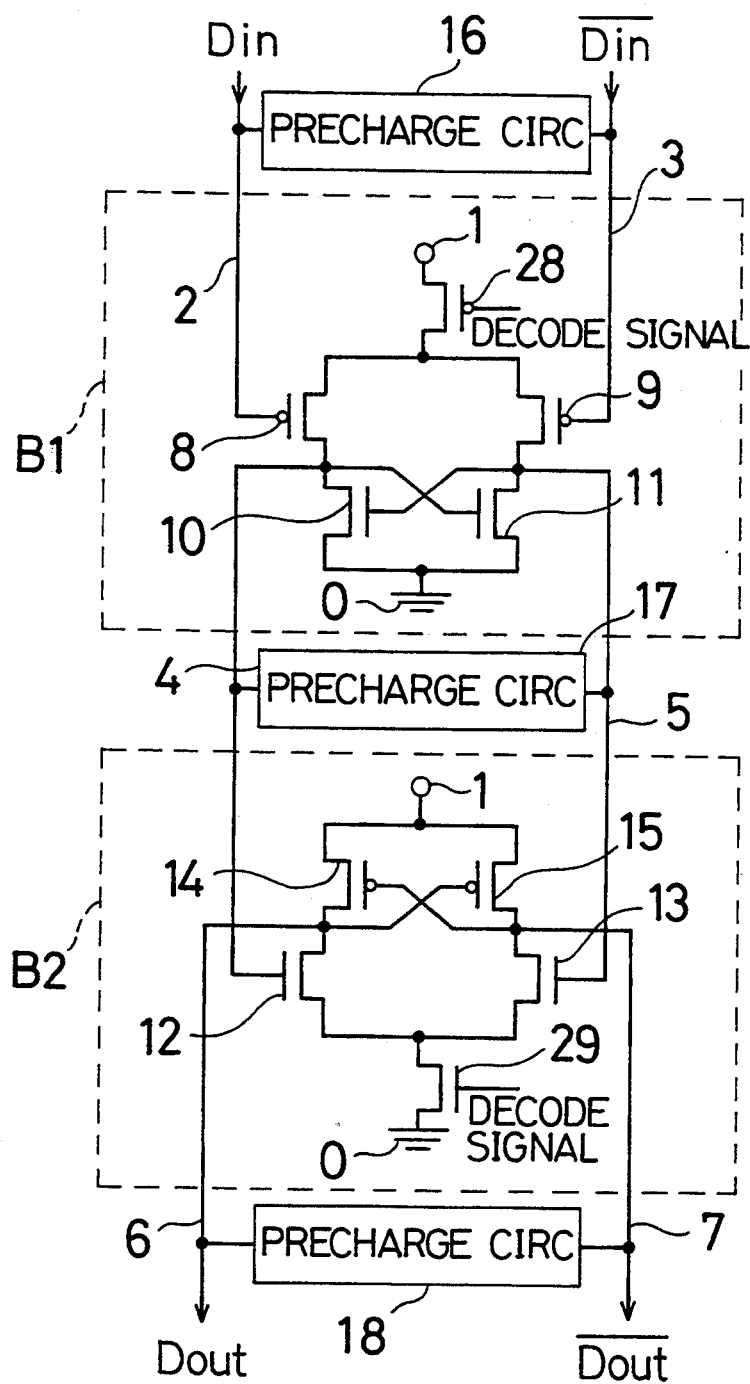
FIG. 8 is a circuit diagram of a differential transmission circuit according to a second embodiment of the present invention.

As shown in FIG. 8, in a differential transmission circuit according to a second embodiment of the present invention, MOS transistor switches 28 and 29 are interposed between the sources of the PMOSs 8 and 9 and the power supply terminal 1 and between the sources of the NMOSs 12 and 13 and the ground terminal 0, respectively. The PMOSs 8 and 9, power supply terminal 1, NMOSs 12 and 13, and ground terminal 0 are identical to those shown in FIG. 3 (the first embodiment). The MOS transistor switches 28 and 29 have their gates connected to decode lines, respectively. In FIG. 8, the first and second differential amplifying circuits are designated by B1 and B2, respectively.

In the case where a specific differential transmission circuit was selected from a plurality of differential transmission circuits, switches were conventionally provided so as to intervene in the output data lines of the differential transmission circuits. In this case, however input data actually operates the differential transmission circuits out of use as well, so that consumed current is disadvantageously increased.

According to the present embodiment, the differential transmission circuits out of use are not operated, so that the overall current consumed is decreased. When one of the two differential transmission circuits is selected, for example, consumed current is halved. However, the effects on the operating speed and consumed current of the differential transmission circuit which actually operates are the same as those obtained in the first embodiment.

EXAMPLE 3

Figure 9:
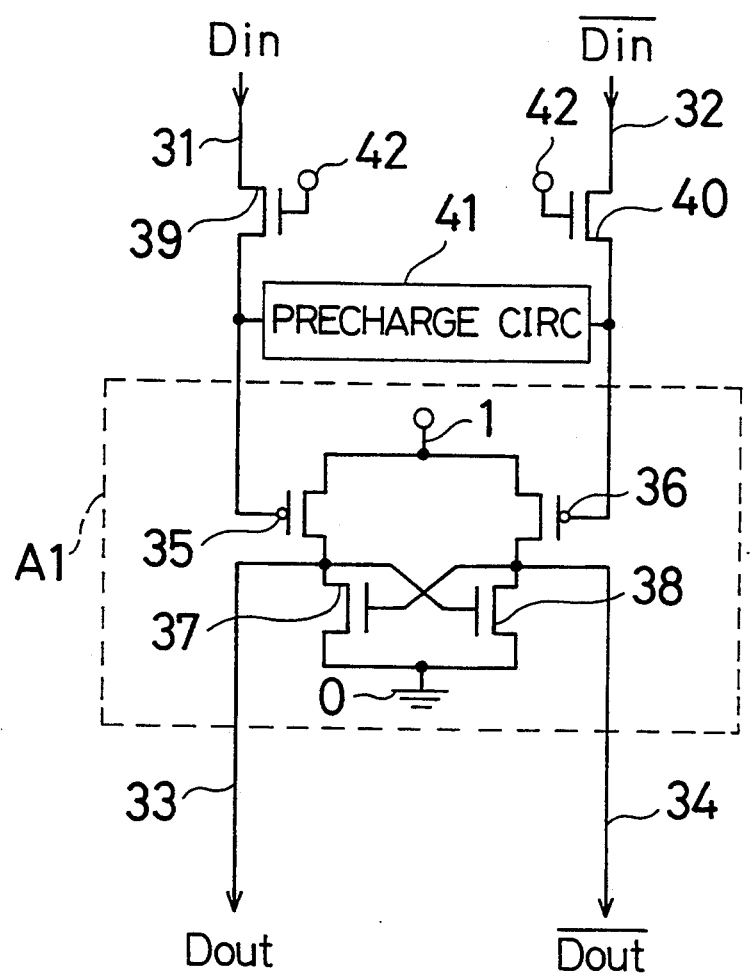
FIG. 9 is a circuit diagram of a differential transmission circuit according to a third embodiment of the present invention.

In FIG. 9, there are shown the ground terminal 0, the power supply terminal 1 having a first power supply voltage, a power supply terminal 42 having a second power supply voltage, complementary input data lines 31 and 32, and complementary output data lines 33 and 34. The differential amplifying circuit A1 comprises a pair of PMOSs 35 and 36 for receiving input data at their gates and a pair of NMOSs 37 and 38 which constitute latch circuits for the output data lines 33 and 34, similarly to the first embodiment. Another pair of NMOSs 39 and 40 have their gates connected to the power supply terminal 42. A precharge circuit 41 is for charging the gates of the PMOSs 35 and 36 so that each of their voltages reaches the first power supply voltage.

In the differential transmission circuit in which the input data lines 2 and 3 are precharged so that each of their voltages reaches the power supply voltage and data is received at the gates of the PMOSs 8 and 9 of the first embodiment (FIG. 3), if the input data lines 2 and 3 have a large capacitance, considerable time will be required for the voltage variation at the input data line 2 or 3 to exceed the threshold voltage for the PMOS 8 or 9, so that the operation of the differential transmission circuit will be delayed.

In the present embodiment, however, the voltage at each of the precharged input data lines 31 and 32 is kept lower than the first power supply voltage by the magnitude of the threshold voltage for the NMOS 39 or 40 in such a manner as to interpose the NMOSs 39 and 40, which have their gates connected to the power supply terminal 42 having the second power supply voltage, between the input data lines 31 and 32 and the precharge circuit 41 for charging the gates of the PMOSs 35 and 36 so that each of their voltages reaches the first power supply voltage. If the voltage at one of the input data lines 31 and 32 is slightly lowered by the application of input data thereto, the voltage at the gate of the corresponding PMOS 35 or 36 is drastically reduced from the first power supply voltage, for the gate capacitance of the PMOS 35 or 36 is small. Thus, the high-speed operation of the differential transmission circuit can be realized.

The precharge voltage for the input data lines 31 and 32 depends on the threshold voltage for the NMOS 39 or 40. When the second power supply voltage at the gates of the NMOSs 39 and 40 is designated by Vcc, the voltage (the first power supply voltage) for which the precharge circuit 41 charges the gates of the PMOSs 35 and 36 is designated by Vds, the precharge voltage for the input data lines 31 and 32 is designated by Vs, and the threshold voltage for the NMOS 39 or 40 is designated by VT, Vs equals Vds in the case where Vcc>Vds+VT, so that Vs cannot be expected to be lower than Vds. Accordingly, considerable time is required for the voltage variation at the input data line 31 or 32 to reach the voltage at which the differential transmission circuit is activated. However, Vs=Vcc−VT is obtained in the case where VT≦Vcc≦Vds+VT. If the precharge voltage for the input data lines 31 and 32 is lowered by rendering the second power supply voltage Vcc equal to or less than the first power supply voltage Vds, as described above, faster transmission can be performed.

It is also possible to lower the precharge voltage for the input data lines by adding the NMOSs 39 and 40 of the present embodiment to the differential transmission circuit shown in FIG. 3 according to the first embodiment. If this technology is applied to a read data amp. used in a 64-Mb DRAM, the transmission speed is increased by 20 to 30% compared with the first embodiment.

In FIG. 9, the PMOSs 35 and 36 are in the OFF state after the precharging of the input data lines 31 and 32 is completed, for the first power supply voltage is applied to the gates of the PMOSs 35 and 36. Consequently, current is not allowed to flow from the power supply terminal 1 to the ground terminal 0, and hence the power consumption is lowered, similarly to the first embodiment.

EXAMPLE 4

Figure 10:
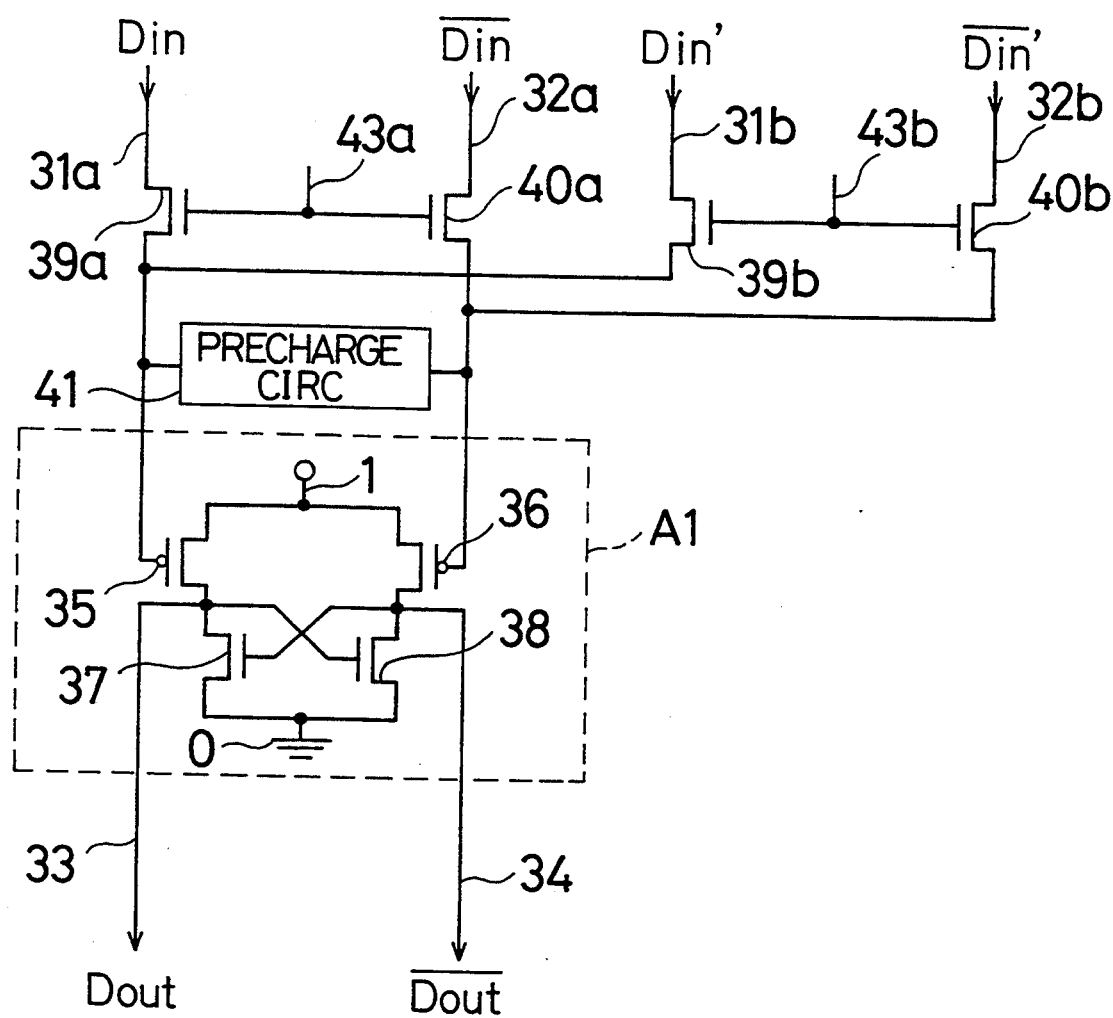
FIG. 10 is a circuit diagram of a differential transmission circuit according to a forth embodiment of the present invention.

As shown in FIG. 10, a differential transmission circuit according to a fourth embodiment of the present invention is different from the differential transmission circuit of the third embodiment (FIG. 9) in that a pair of NMOSs 39a and 40a having their gates connected to a decode signal line 43a are provided so as to intervene in the first input data lines 31a and 32a, respectively, and that a pair of NMOSs 39b and 40b having their gates connected to a decode signal line 43b are provided to intervene in the second input data lines 31b and 32b, respectively.

According to the present invention, if the first input data lines 31a and 32a are selected by the decode signal 43a, the precharge voltage for the first input data lines 31a and 32a is set lower than the precharge voltage for the gates of the PMOSs 35 and 36 by the magnitude of the threshold voltage for the NMOS 39a or 40a. If the second input data lines 31b and 32b are selected by the decode signal 43b, on the contrary, the precharge voltage for the second input data lines 31b and 32b is set lower than the precharge voltage for the gates of the PMOSs 35 and 36 by the magnitude of the threshold voltage for the NMOS 39b or 40b. By lowering the precharge voltage for the first input data lines 31a and 32a or by lowering the precharge voltage for the second input data lines 31b and 32b, as described above, high-speed data transmission comparable to that of the third embodiment can be achieved. Moreover, since the present embodiment is constituted so that the single differential amplifying circuit A1 can be used in common by the two pairs of input data lines 31a and 32a and 31b and 32b, its power consumption and layout area can be reduced.

In place of the precharge circuit 41 shown in FIG. 10, it is also possible to connect the first input data lines 31a and 32a to the first precharge circuit for charging the first input data lines 31a and 32a so that each of their voltages reaches a predetermined low value and to connect the second input data lines 31b and 32b to the second precharge circuit for charging the second input data lines 31b and 32b so that each of their voltages reaches a predetermined low value. In this case, the input data line which is not selected may also be precharged.

EXAMPLE 5

Figure 11:
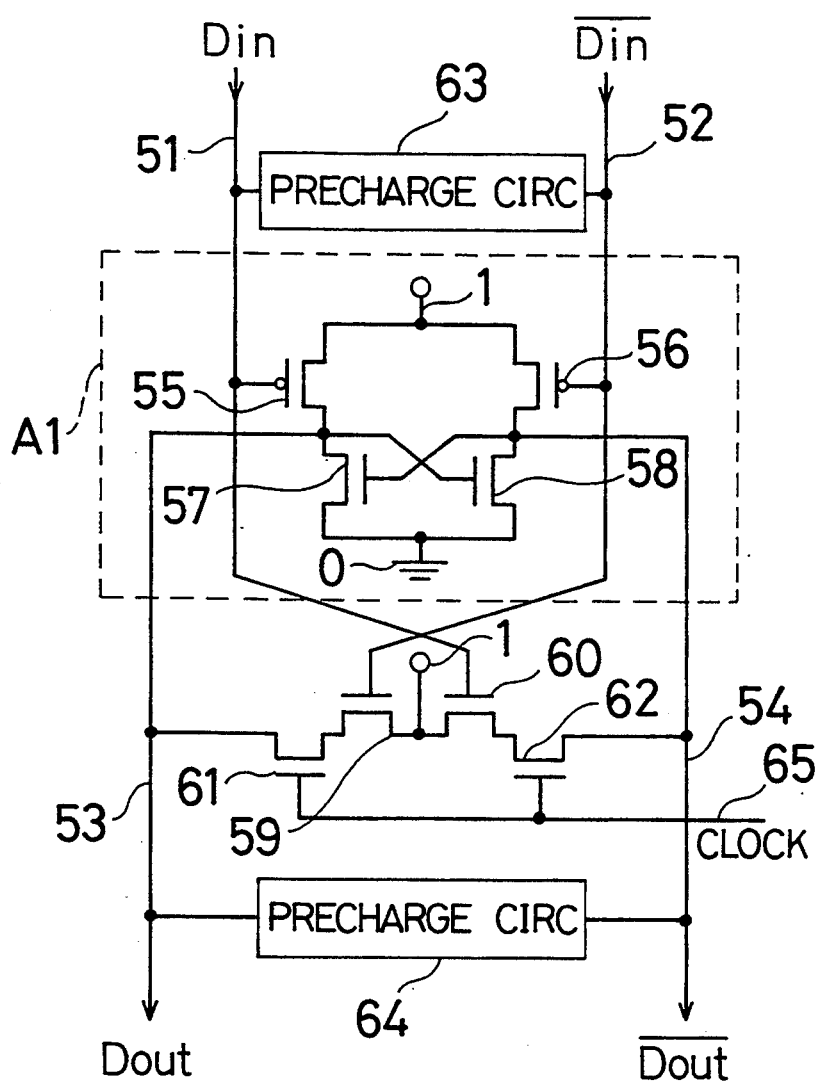
FIG. 11 is a circuit diagram of a differential transmission circuit according to a fifth embodiment of the present invention.

In FIG. 11, there are shown the ground terminal 0, power supply terminal 1, complementary input data lines 51 and 52, and complementary output data lines 53 and 54. The differential amplifying circuit A1 comprises a pair of PMOSs 55 and 56 for receiving input data at their gates and a pair of NMOSs 57 and 58 constituting latch circuits for the output data lines 53 and 54, similarly to the first embodiment. Another pair of NMOSs 59 and 60 have their gates connected to the input data lines 51 and 52, their sources connected to the output data lines 53 and 54 via MOS transistor switches 61 and 62, and their drains connected to the power supply terminal 1. A first precharge circuit 63 is for precharging the input data lines 51 and 52 so that each of their voltages reaches the power supply voltage. A second precharge circuit 64 is for precharging the output data lines 53 and 54 so that each of their voltages reaches the ground voltage. A clock signal 65 is applied in common to the gates of the MOS transistor switches 61 and 62.

The operation of the differential transmission circuit thus constituted will be described. Initially, before input data (potential difference) is applied to the input data lines 51 and 52, the input data lines 51 and 52 are precharged (equalized) by the first precharge circuit 63 so that each of their voltages reaches the power supply voltage, while the output data lines 53 and 54 are precharged (equalized) by the second precharge circuit 64 so that each of their voltages reaches the ground voltage. After input data is applied so as to change the voltage of the input data line 51 or 52, the clock signal 65 is applied so as to turn both of the MOS transistor switches 61 and 62 ON.

If the voltage variation at one of the input data lines 51 and 52 exceeds the threshold voltage for the PMOS 55 or 56 prior to the application of the clock signal 65, the corresponding PMOS 55 or 56 is immediately turned ON, so as to start charging the output data line 53 or 54 to which its drain is connected. After the clock signal 65 is applied, the corresponding NMOS 59 or 60 functions to supplement the charging of the output data line 53 or 54, so that the transmission of data from the input data lines 51 and 52 to the output data lines 53 or 54 is performed at high speed.

If the voltage variation at the input data line 51 or 52 does not exceed the threshold voltage for the PMOS 55 or 56 on applying the clock signal 65, the NMOS 59 or 60 starts charging the corresponding output data line 53 or 54 before the PMOS 55 or 56 does. Since the voltages at the gates of the NMOSs 59 and 60 are differentiated by the potential difference of the input data in this case, the output data lines 53 and 54 are charged by the NMOSs 59 and 60 which have different current-supplying abilities, respectively, so that data transmission free from malfunction can be performed.

As described above, the differential transmission circuit according to the present invention can eventually be operated by the application of the clock signal 65, so that data transmission can be performed at high speed.

It is also possible to interchange the positions of the NMOS 59 and the MOS transistor 61 between the power supply terminal 1 and the output data line 53 or to interchange the positions of the NMOS 60 and the MOS transistor switch 62 between the power supply terminal 1 and the output data line 54. If a MOS transistor switch is interposed between the power supply terminal 1 and the sources of the PMOSs 55 and 56 so as to disconnect them, even when an intermediate voltage is applied to the gates of the PMOSs 55 and 56 through equalization of the input data lines 51 and 52 during precharging, current is prevented from flowing from the power supply terminal 1 to the ground terminal 0.

EXAMPLE 6

Figure 12:
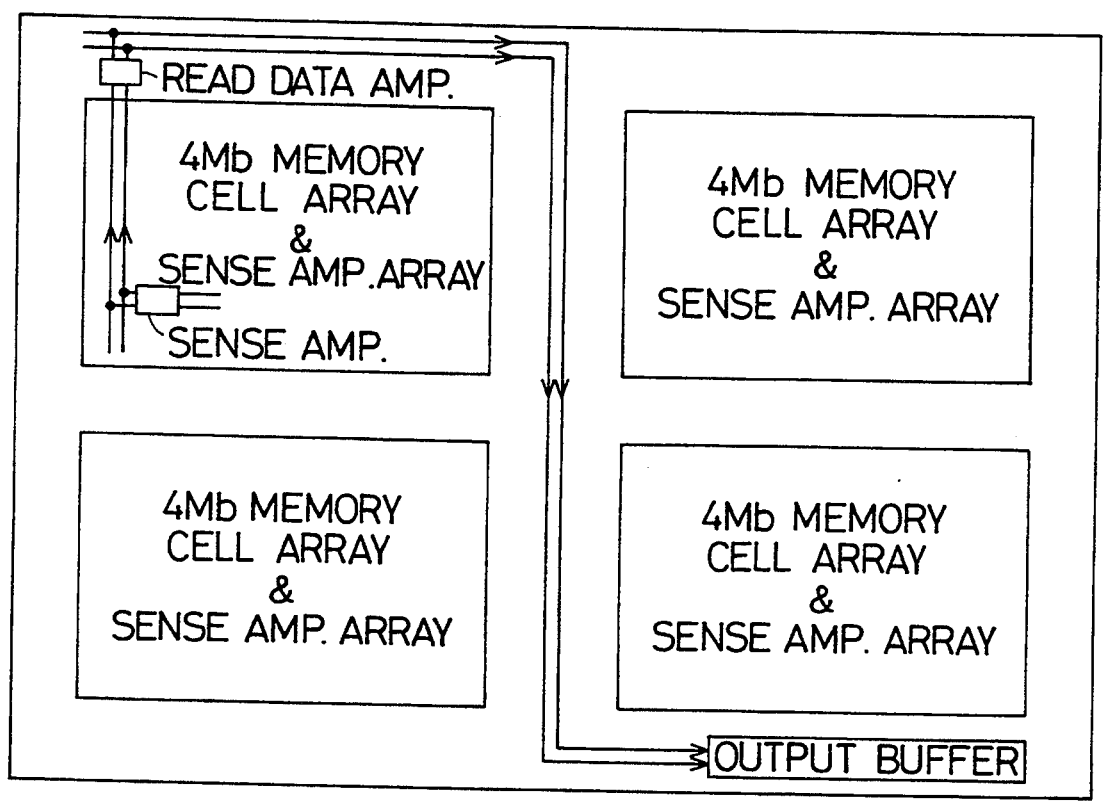
FIG. 12 is a block diagram of a 16-Mb DRAM in which a differential transmission circuit according to a sixth embodiment of the present invention is used as a read data amp.
Figure 13:
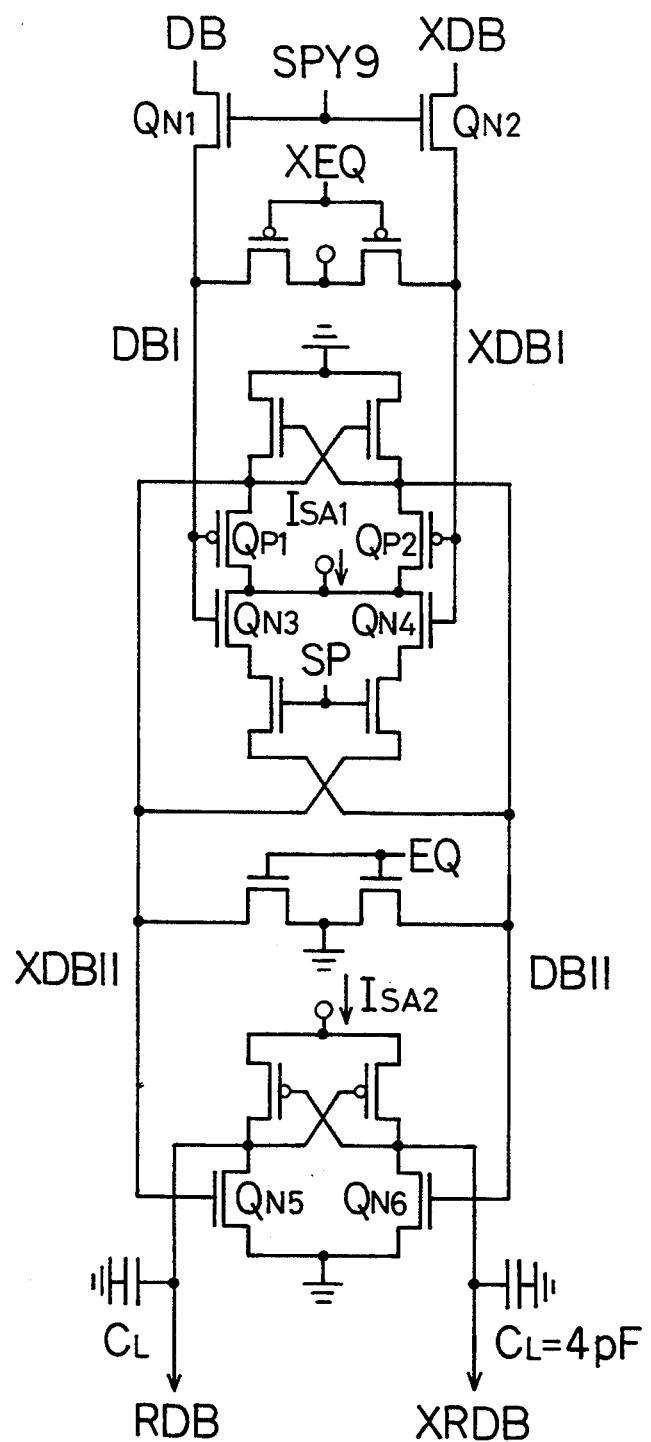
FIG. 13 is a circuit diagram of the read data amp. shown in FIG. 12.
Figure 14:
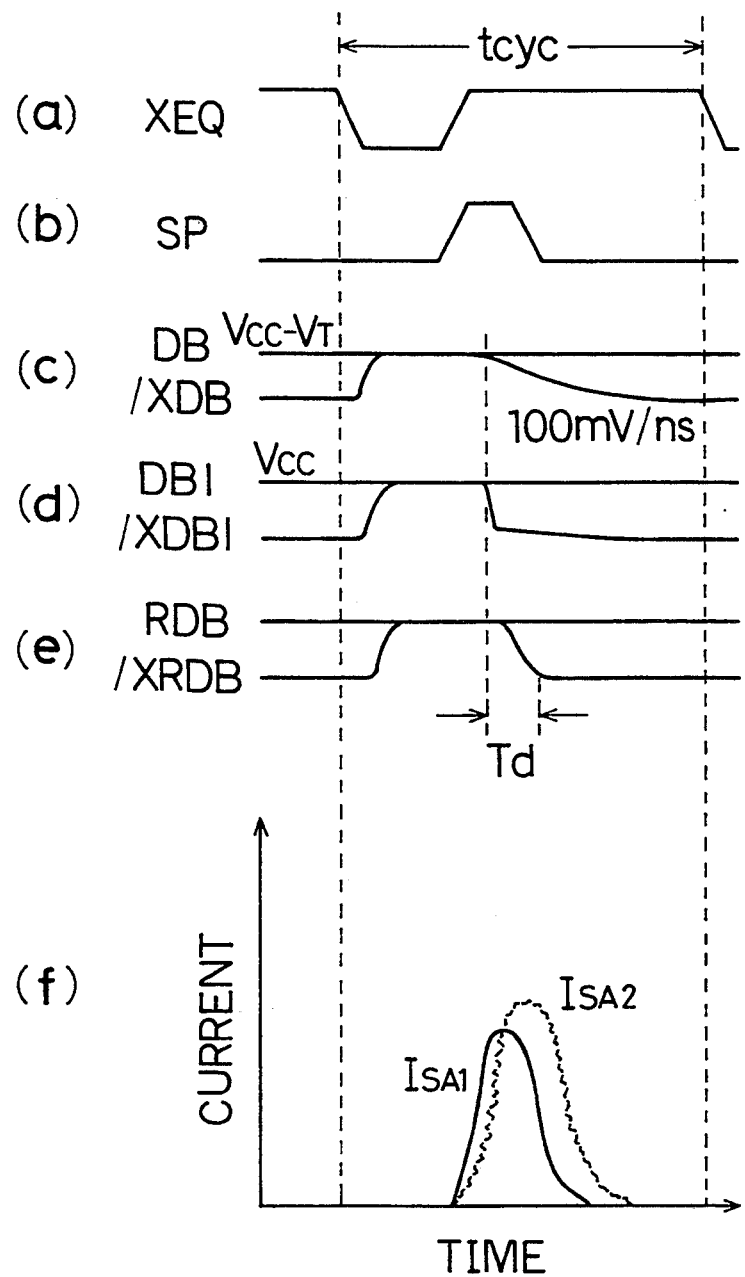
FIGS. 14(a) to 14(f) are wave form charts illustrating the operation of the read data amp. of FIG. 13.

An embodiment will be described in which the differential transmission circuit of the present invention is used as a read data amp. in a 16-Mb DRAM shown in FIG. 12. The structure of the read data amp. is as shown in FIG. 13, which has the combined characteristics of those of the first, fourth, and fifth embodiments. FIG. 13 shows input data lines DB/XDB, input data lines DBI/XDBI which are separated from the input data lines DB/XDB by the NMOSs QN1 and QN2, internal data lines DBII/XDBII, output data lines RDB/XRDB, a decode signal SPY9, precharge control signals EQ/XEQ, a clock signal SP, currents ISA1 and ISA2 flowing from the power supply terminal to the ground terminal.

Figure 15:
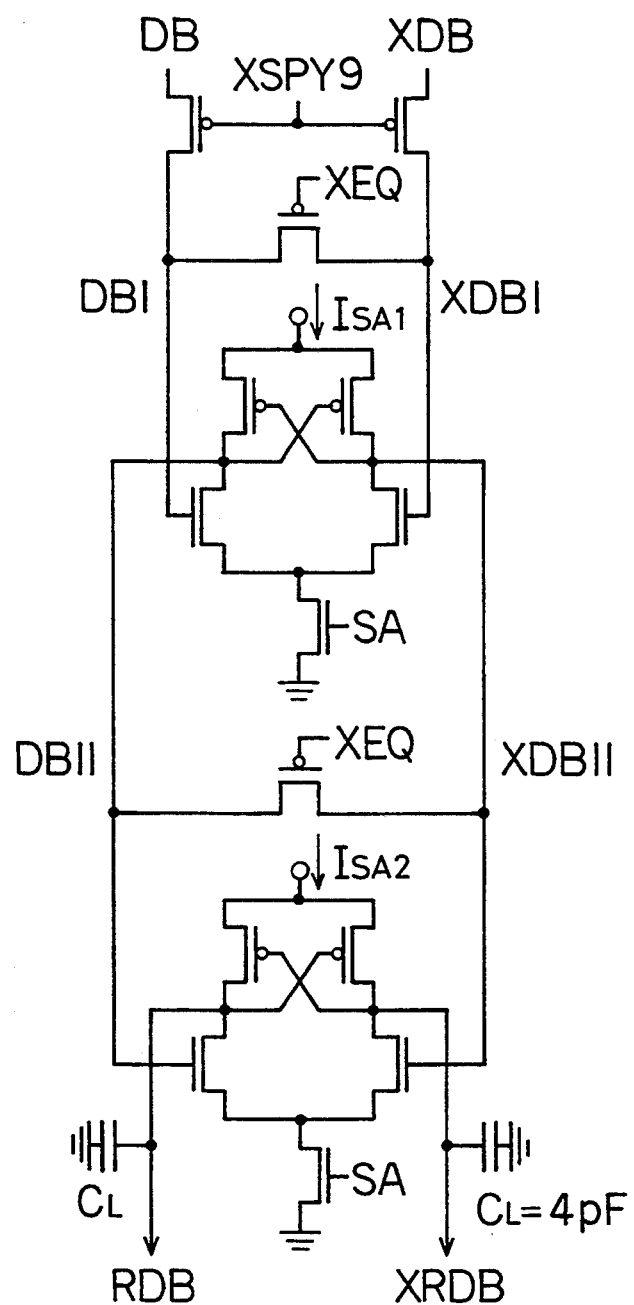
FIG. 15 is a circuit diagram of a conventional read data amp.
Figure 16:
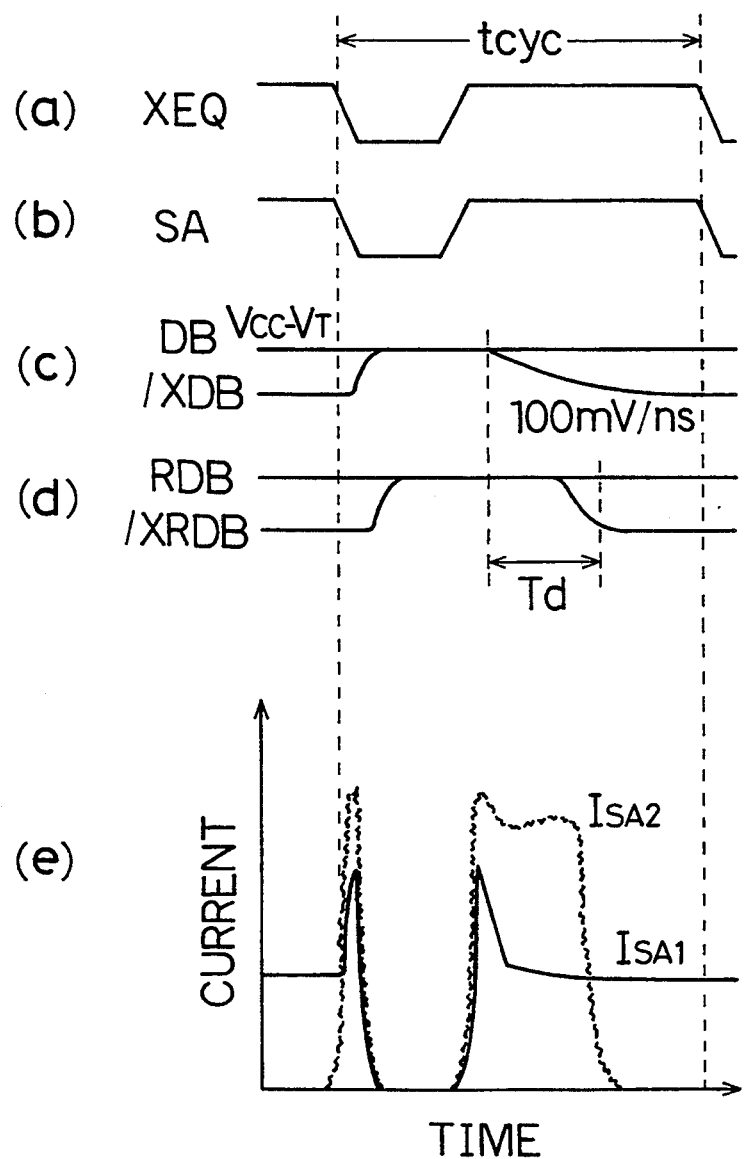
FIGS. 16(a) to (e) are waveform charts illustrating the operation of the read data amp. of FIG. 15.

FIG. 15 shows a comparative example of the read data amp. which corresponds to the structure of the conventional differential transmission circuit of FIG.1. The clock signal SA is mandatory to the read data amp.

Figure 17:
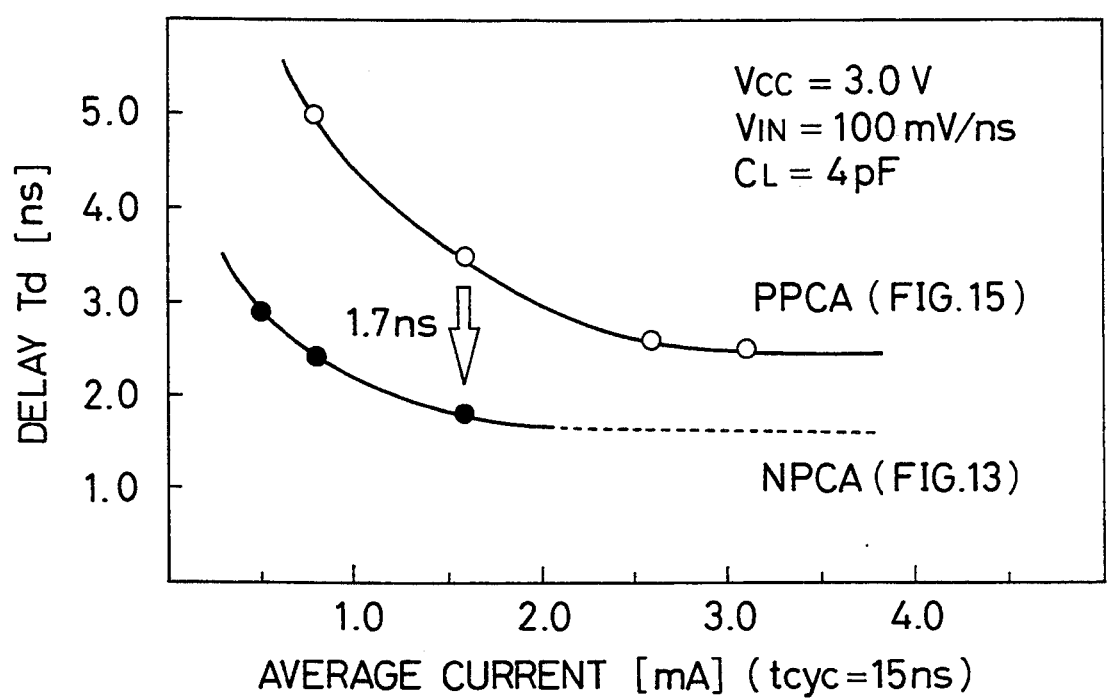
FIG. 17 is a graph showing the delay times of the read data amps. of FIG. 13 and FIG. 15 for comparison.

By comparing FIGS. 14(a) to 14(f) which are the wave form charts of the read data amp. NPCA of FIG. 13 with FIGS. 16(a) to 16(e) which are the wave form charts of the read data amp. PPCA of FIG. 15, it will be understood that the delay time Td between the input data and the output data is decreased and that the flow of the currents ISA1 and ISA2 is prevented according to the present embodiment (FIG. 13). As shown in FIG. 17, the difference in delay time Td between the NPCA and PPCA reaches 1.7ns when the wiring capacitance CL of the output data lines RDB/XRDB is 4pF, the voltage of input VIN to the input data lines DB/XDB is 100mV/ns, the power supply voltage Vcc is 3.0V, and the means consumed current in one cycle (15ns) is 1.6mA.

We claim:
1. A differential transmission circuit comprising:
   a first differential amplifying circuit for receiving complementary sets of input data at the gates of first conductive MOS transistors and for transmitting complementary sets of internal data; and
   a second differential amplifying circuit for receiving said complementary sets of internal data at the gates of second conductive MOS transistors and for transmitting complementary sets of output data, the conductivity of said second conductive MOS transistors being different from the conductivity of said first conductive MOS transistors.

2. A differential transmission circuit comprising:

a first differential amplifying circuit having a pair of first p-channel MOS transistors which have their gates connected to complementary input data lines, respectively, their sources connected to a power supply terminal, and their drains connected to complementary internal data lines, respectively, and a pair of first n-channel MOS transistors which have their gates connected to said complementary internal data lines, respectively, their sources connected to a ground terminal, and their drains connected to the internal data lines, respectively, the gate and drain of each of said first n-channel MOS transistors being connected to the different internal data lines, respectively;

a second differential amplifying circuit having a pair of second n-channel MOS transistors which have their gates connected to said complementary internal data lines, respectively, their sources connected to the ground terminal, and their drains connected to complementary output data lines, respectively, and a pair of second p-channel MOS transistors which have their gates connected to said complementary output data lines, their sources connected to the power supply terminal, and their drains connected to the output data lines, respectively, the gate and drain of each of said second p-channel MOS transistors being connected to the different output data lines, respectively;

a first precharge circuit for charging said input data lines so that each of their voltages reaches a value at which said first p-channel MOS transistors are turned off;

a second precharge circuit for charging said internal data lines so that each of their voltages reaches a value at which said first and second n-channel MOS transistors are turned off; and a third precharge circuit for charging said output data lines so that each of their voltages reaches a value at which said second p-channel MOS transistors are turned off.

3. A differential transmission circuit according to claim 2, further comprising:

a first MOS transistor switch which is interposed between the power supply terminal and the sources of the first p-channel MOS transistors of said first differential amplifying circuit and which has its gate connected to a decode signal line; and a second MOS transistor switch which is interposed between the ground terminal and the sources of the second n-channel MOS transistors of said second differential amplifying circuit and which has its gate connected to another decode signal line.

4. A differential transmission circuit for receiving data from complementary input data lines at the gates of its pair of p-channel MOS transistors and for transmitting the data, comprising:

a precharge circuit which is connected to the gates of said p-channel MOS transistors for the charging of said gates so that each of their voltages reaches a first power supply voltage; and n-channel MOS transistors which have their gates connected to power supply terminals having a second power supply voltage, respectively, and which are interposed between said complementary input data lines and the gates of said p-channel MOS transistors, respectively.

5. A differential transmission circuit according to claim 4, wherein the second power supply voltage is equal to or less than the first power supply voltage.

6. A differential transmission circuit for receiving data from complementary input data lines at the gates of its pair of p-channel MOS transistors, comprising:

n-channel MOS transistors which are interposed between said complementary input data lines and said p-channel MOS transistors, respectively, and which have their gates connected to decode lines; and a precharge circuit which is connected to the gates of said p-channel MOS transistors for the charging of said gates so that each of their voltages reaches a power supply voltage.

7. A differential transmission circuit comprising:

a first differential amplifying circuit having a pair of p-channel MOS transistors which have their gates connected to complementary input data lines, respectively, their sources connected to an power supply terminal, and their drains connected to complementary output data lines, respectively, and a pair of first n-channel MOS transistors which have their gates connected to said complementary output data lines, respectively, their sources connected to a ground terminal, and their drains connected to the output data lines, respectively, the gate and drain of each of said first n-channel transistors being connected to the different output data lines, respectively;

a second differential amplifying circuit having a pair of second n-channel MOS transistors which have their gates connected to said complementary input data lines, respectively, their drains connected to the power supply terminal, and their sources connected via a MOS transistor switch to the drains of said p-channel MOS transistors which are connected to the input data lines, respectively, the drain of each of said second n-channel MOS transistors being connected to the drain of the p-channel MOS transistor which is connected to the input data line to which the gate of the n-channel MOS transistor is not connected; and a precharge circuit which is connected to said input data lines and to said output data lines.

8. A differential transmission circuit comprising:

a first differential amplifying circuit for receiving data from complementary input data lines at the gates of its p-channel MOS transistors and for transmitting the data to complementary internal data lines;

a second differential amplifying circuit for receiving the data from said complementary internal data lines and for transmitting the data to complementary output data lines; and a precharge circuit which is connected to said input data lines and to said internal data lines, said first differential amplifying circuit comprising:

a pair of p-channel MOS transistors which have their gates connected to said complementary input data lines, respectively, their sources connected to a power supply terminal, and their drains said complementary internal data lines, respectively;

a pair of first n-channel MOS transistors which have their gates connected to said complementary internal data lines, respectively, their sources connected to a ground terminal, and their drains connected to said internal data lines, respectively, the gate and drain of each of said first n-channel transistors being connected to the different internal data lines, respectively; and a pair of second n-channel MOS transistors which have their gates connected to said complementary input data lines, respectively, their drains connected to the power supply terminal, and their sources connected via a MOS transistor switch to the drains of said p-channel MOS transistors which are connected to the input data lines, respectively, the drain of each of said second n-channel MOS transistors being connected to the drain of the p-channel MOS transistor which is connected to the input data line to which the gate of the n-channel MOS transistor is not connected.

* * * * *